(12) United States Patent
Allen et al.

(10) Patent No.: US 9,157,150 B2
(45) Date of Patent: Oct. 13, 2015

(54) METHOD OF OPERATING A PROCESSING CHAMBER USED IN FORMING ELECTRONIC DEVICES

(75) Inventors: Michael B. Allen, Buda, TX (US); Jesse C. Ramos, Austin, TX (US); Jeffrey P. Geuea, Bastrop, TX (US); Allan T. Nelson, Bastrop, TX (US)

(73) Assignee: Cypress Semiconductor Corporation, San Jose, CA (US)

(*) Notice: Subject to any disclaimer, the term of this patent is extended or adjusted under 35 U.S.C. 154(b) by 1709 days.

(21) Appl. No.: 11/950,339

(22) Filed: Dec. 4, 2007

(65) Prior Publication Data
US 2009/0142473 A1 Jun. 4, 2009

(51) Int. Cl.
*B05D 5/12* (2006.01)
*C23C 16/44* (2006.01)

(52) U.S. Cl.
CPC .................................. *C23C 16/4401* (2013.01)

(58) Field of Classification Search
USPC .......................................................... 427/58
See application file for complete search history.

(56) References Cited

U.S. PATENT DOCUMENTS

| | | | |
|---|---|---|---|
| 5,932,286 A * | 8/1999 | Beinglass et al. | 427/255.18 |
| 6,054,684 A * | 4/2000 | Pas et al. | 219/390 |
| 6,165,810 A * | 12/2000 | Morimoto | 438/30 |
| 2002/0106846 A1* | 8/2002 | Seutter et al. | 438/200 |
| 2004/0087143 A1* | 5/2004 | Norman et al. | 438/680 |
| 2004/0146827 A1* | 7/2004 | Beatty et al. | 432/1 |
| 2005/0121142 A1* | 6/2005 | Nakao et al. | 156/345.29 |
| 2005/0136657 A1* | 6/2005 | Yokoi et al. | 438/680 |
| 2007/0243317 A1* | 10/2007 | Du Bois et al. | 427/98.9 |

FOREIGN PATENT DOCUMENTS

WO  WO 2004/008491  * 1/2004

* cited by examiner

*Primary Examiner* — Austin Murata

(57) ABSTRACT

Provided herein is a method of processing an electronic device including operating a processing chamber at a first temperature while a workpiece is being processed and removing the workpiece and a carrier holding the workpiece from the processing chamber while decreasing the temperature within the processing chamber to a second temperature significantly lower than the first temperature. The method also includes increasing the temperature within the processing chamber to a third temperature significantly greater than the second temperature and significantly less than the first temperature while the processing chamber has no workpiece or carrier within.

19 Claims, 2 Drawing Sheets

METHOD OF OPERATING A PROCESSING CHAMBER USED IN FORMING ELECTRONIC DEVICES

BACKGROUND

1. Field of the Disclosure

The following application is directed to a method of operating a processing chamber used to form electronic devices, and particularly directed to a method of reducing outgassing of harmful contaminants within the processing chamber.

2. Description of the Related Art

Typically, when operating a processing chamber, such as a deposition chamber, gases are provided within the chamber to initiate a reaction, such that a particular product of that reaction is deposited on workpieces within the processing chamber. During processing, the temperature within the chamber is controlled such that a proper environment exists for the reaction and the formation of the product. FIG. 1 illustrates a typical thermal processing plot of temperature versus time providing a known method of operating a processing chamber used in forming electronic devices. In particular, FIG. 1 illustrates particular regions designated by dashed lines indicating time periods for conducting certain operations. Typically, the process is initiated within region 101, wherein workpieces are loaded into the processing chamber. After loading the workpieces within region 101, the temperature within the processing chamber is increased within region 103 to a suitable deposition temperature ($T_D$). When the processing chamber reaches the deposition temperature, and reacted to form a chemical product that is deposited as a layer of material on the workpieces.

After completing the deposition process within region 105, the temperature within the processing chamber is reduced as illustrated within region 107, and can be held for a period as illustrated in region 109 to allow the workpieces to cool. After cooling, the workpieces are removed and the process is reinitiated as illustrated in region 111, wherein workpieces are placed inside the processing chamber at the same temperature at which the workpieces were removed within region 109. The remainder of the process is then repeated, including increasing the temperature to a deposition temperature and then reducing the temperature to pull the processed workpieces out and load a new batch of workpieces, as illustrated in regions 111, 113, 115, 117, and 119.

During processing, other chemical products (i.e., byproducts) can be formed within the processing chamber. These byproducts can be generally damaging to components within the processing chamber and the workpieces. The production of these harmful byproducts increases the cost of running the equipment, reduces production, and increases defects on the workpieces.

BRIEF DESCRIPTION OF THE DRAWINGS

The present disclosure may be better understood, and its numerous features and advantages made apparent to those skilled in the art by referencing the accompanying drawings.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

Generally, workpieces having the electronic components thereon, are placed within the processing chamber, and layers can be formed on the workpieces by the combination of certain chemicals within the processing chamber. One particular forming process utilizing such a processing chamber can include a deposition process, such as a chemical vapor deposition (CVD) processes, which can have various forms, for example, low pressure chemical vapor deposition (LPCVD), atmospheric chemical vapor deposition (ACVD), and plasma-enhanced chemical vapor deposition (PECVD). During such CVD processes, in addition to the formation of a certain compound useful in forming the electronic device, other chemicals can be formed within the processing chamber, such as byproducts. Certain byproducts formed within the processing chamber can be harmful to the components of the processing chamber as well as the workpieces processed therein.

In an exemplary, non-limiting embodiment, after completing the deposition process, removing the workpieces from the processing chamber, and before new workpieces are placed inside the processing chamber, an outgassing operation can be performed. This particular outgassing operation facilitates lessening of certain byproducts within the processing chamber. Moreover, such an outgassing operation can be facilitated by periods of cooling and heating.

Figure 1:
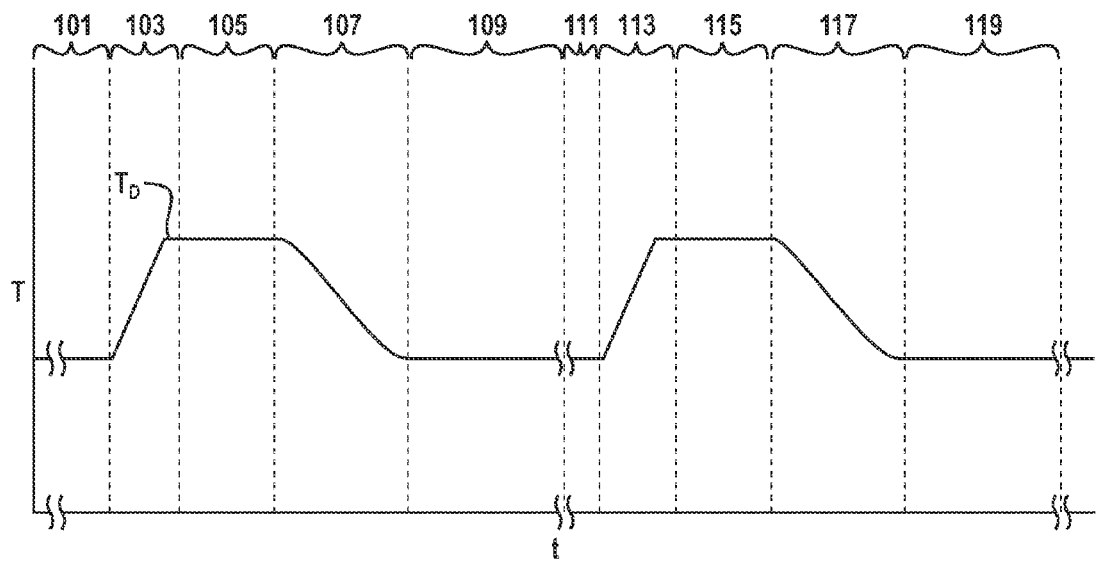
FIG. 1 includes a processing schedule illustrating a temperature versus time plot for operating a processing chamber in accordance with a prior art method.
Figure 2:
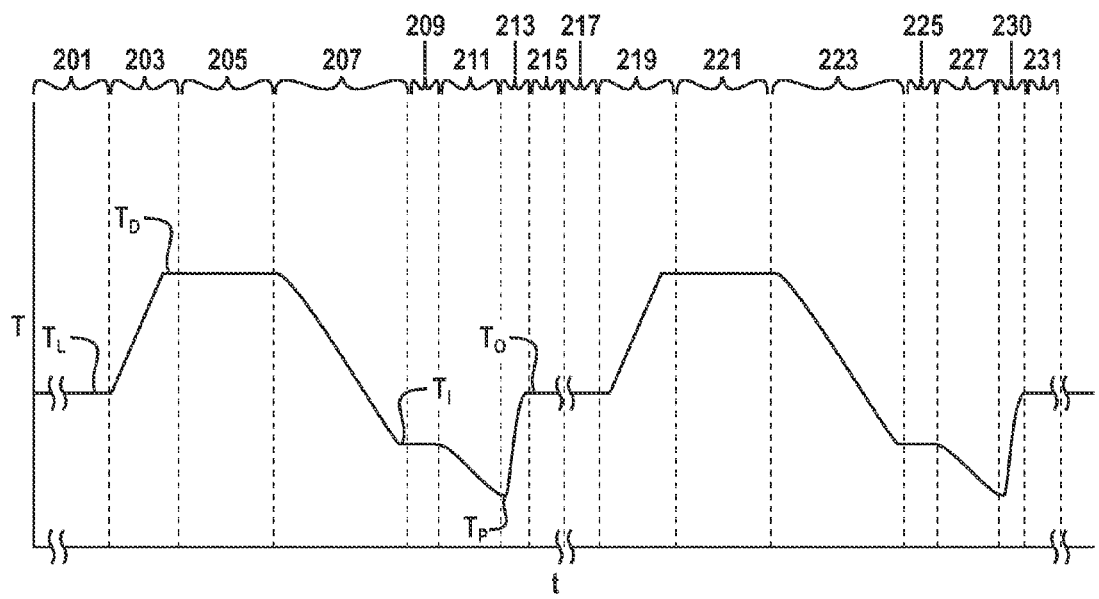
FIG. 2 includes a processing schedule illustrating a temperature versus time plot for operating a processing chamber in accordance with one embodiment.
Figure 3:
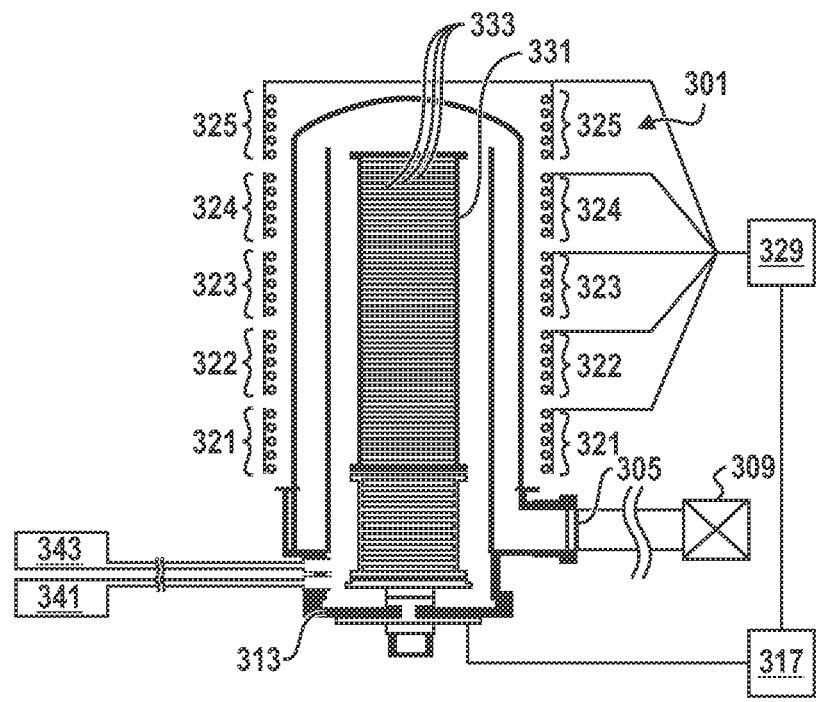
FIG. 3 includes a cross-sectional diagram of a processing chamber with workpieces and a carrier contained therein in accordance with one embodiment.
Figure 4:
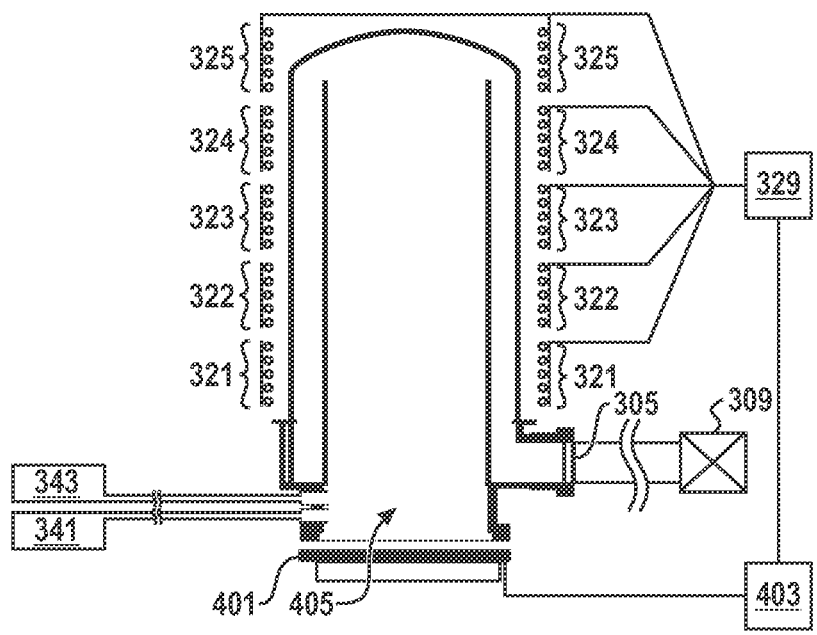
FIG. 4 includes a cross-sectional illustration of a processing chamber having no workpieces or carrier contained therein in accordance with one embodiment.

Attention is now directed to particular embodiments of forming an electronic device through processes illustrated in FIG. 2 and articles illustrated in FIGS. 3 and 4. FIG. 2 includes a processing schedule illustrating a plot of temperature versus time for operating a processing chamber in accordance with one embodiment. As further illustrated, FIG. 2 includes regions designated by dashed lines indicating different time periods and operations during processing. The processing of workpieces is initiated within region 201, wherein workpieces can be loaded onto a carrier which in turn is loaded into a processing chamber. The workpieces can include semiconductor material or insulative material, or any combination thereof. For example, the workpiece can include a monocrystalline semiconductor wafer, semiconductor-on-insulator (SOI) wafer, a flat panel display (e.g., a silicon layer over a glass plate), or other substrates conventionally used to form electronic devices. Additionally, the workpiece and particularly the monocrystalline semiconductor wafers can be doped, such as including an n-type or p-type dopant. Moreover, the workpiece can include electronic devices or portions of electronic devices previously formed thereon.

Upon initiating the process within region 201, the workpieces can be loaded into the processing chamber at a loading temperature ($T_L$). The temperature of the processing chamber during loading (i.e., the loading temperature) can be the same temperature as used during the deposition process (i.e., the deposition temperature), however, more typically the loading temperature is less than the deposition temperature. In one embodiment, the loading temperature is less than the deposition temperature by at least approximately 5% of the deposition temperature. For example, if the deposition temperature is 500° C., the loading temperature can be at least 25° C. below the deposition temperature. In another embodiment, the loading temperature is at least approximately 10% less, such as at least approximately 20% less, or even at least approximately 25% less than the deposition temperature. Still, according to another embodiment, the loading temperature is less than the deposition temperature by not greater than approximately 50% of the deposition temperature.

After loading the workpieces and the carrier within the processing chamber, the processing chamber can be closed and sealed by a door. The door is suitable for sealing the interior of the processing chamber from the ambient environment and facilitates control of the atmosphere within the processing chamber during processing, particularly the use of a reduced pressure atmosphere. As such, after closing the door and sealing the chamber, the pressure within the processing chamber may be reduced according to a conventional or proprietary technique, which can include a pump down and leak check procedure.

After the atmosphere within the process chamber is suitable, the temperature can be increased up to a deposition temperature ($T_D$) as illustrated within region 203. Generally increasing the temperature within the process chamber is accomplished by turning on heating elements, which can be located adjacent to and wrapping around the periphery of the process chamber. Depending upon the deposition temperature, the process of increasing the temperature within the processing chamber generally can last for a time period of not less than approximately 5 minutes. In other embodiments, the time period for increasing the temperature to a suitable deposition temperature can be greater, such as not less than approximately 10 minutes, or not less than approximately 15 minutes, or not less than approximately 20 minutes, or even not less than approximately 60 minutes. Generally, the time period for heating the processing chamber to the deposition temperature can be within a range between approximately 10 minutes and approximately 20 minutes.

In another embodiment, the heating rate for changing the temperature within the processing chamber from the loading temperature to the deposition temperature is not greater than approximately 15° C./minute. In another embodiment, the heating rate is less, such as not greater than approximately 12° C./minute, or not greater than approximately 10° C./minute. Accordingly to another embodiment, the heating rate is at least approximately 1° C./minute, or at least approximately 3° C./minute. In one particular embodiment, the heating rate is within a range between approximately 3° C./minute and approximately 10° C./minute.

After heating the processing chamber, the temperature within the processing chamber can be stabilized at the deposition temperature ($T_D$), and after which the deposition process can be initiated within region 205. Generally, the process of stabilizing the temperature within the processing chamber at the deposition temperature lasts for a time period of not less than approximately 10 minutes. In other embodiments, the stabilization process can take longer, such as not less than approximately 15 minutes, or not less than approximately 20 minutes, not less than approximately 60 minutes, or even not less than approximately 120 minutes. According to one particular embodiment, the time period suitable for stabilizing the temperature within the processing chamber at the deposition temperature is within a range between approximately 15 minutes and approximately 60 minutes.

The deposition temperature is dependent in part on the type of layer being formed on the workpieces and the gases used to form the layer. In one embodiment, the deposition temperature is at least approximately 350° C. Such a temperature is particularly suitable for PECVD processing chambers. According to another embodiment, the deposition temperature can be greater, such as at least approximately 500° C., such as at least approximately 600° C., or even at least approximately 650° C. In another embodiment, the deposition temperature is not greater than approximately 1000° C., such as not greater than approximately 900° C. or even not greater than approximately 800° C. According to one particular embodiment, the deposition temperature is within a range between approximately 650° C. and approximately 775° C.

The deposition process includes flowing gases into the processing chamber, wherein the gases react and form a compound which is deposited as a layer of material on the workpieces. According to one embodiment, the deposition process can include flowing a nitrogen-containing gas into the processing chamber. In one embodiment, the nitrogen-containing gas further includes hydrogen. According to one particular embodiment, suitable nitrogen-containing gases can include $N_2$, $NH_3$, $N_2H_4$, or any combination thereof.

In addition to flowing a nitrogen-containing gas into the processing chamber, the deposition process can further include flowing a halogen-containing gas into the processing chamber. As used herein, halogens include elements contained in Group VIIA of the Period Table. As such, suitable halogen-containing gases can include a compound including F, Cl, Br, I, and At. In one particular embodiment, the halogen-containing gas is a chlorine-containing (Cl) gas. Additionally, the halogen-containing gas can include another element, such as metal. According to one embodiment, the halogen-containing gas can include a metal such as silicon, cobalt, molybdenum, titanium, tungsten, tantalum, or any combination thereof. According to one particular embodiment, the halogen-containing gas can have the general formula of $Si_aH_bX_c$, wherein X is a halogen (Cl, Br, I or the like), a is 1 to 3, (b+c)=(2a+2), and b or c can be as low as 1.

The combination of the nitrogen-containing gas and the halogen-containing gas facilitates a reaction to form a layer of material on the workpiece. According to one particular embodiment, the layer of the material formed on the workpiece, can be a nitrogen-containing material. Additionally, the nitrogen-containing layer on the material can include a metal. In one embodiment, the metal within the nitrogen-containing layer includes silicon, cobalt, molybdenum, titanium, tungsten, tantalum, or any combination thereof. According to a particular embodiment, the layer of material formed on the workpiece can include $Si_3N_4$ or TiN.

The time period of the deposition process depends in part upon the desired thickness of the layer deposited. Generally, the deposition process may last for a period of at least approximately 15 minutes. Other embodiments may use a longer deposition process, such as at least approximately 30 minutes, such as at least approximately 45 minutes, or even at least approximately 120 minutes. In one particular embodiment, the time period of the deposition process is within a range between approximately 25 minutes and approximately 60 minutes.

The average thickness of the nitrogen-containing layer formed on the workpiece can be generally not greater than approximately 300 nm. According to another embodiment, the average thickness of the nitride-containing layer formed on the workpiece can be not greater than approximately 200 nm, such as not greater than approximately 100 nm. In one particular embodiment, the average thickness of the nitrogen-containing layer formed on the workpiece is within a range between approximately 10 nm and approximately 150 nm.

According to one embodiment, the formation of the nitrogen-containing layer includes the formation of an insulating structure within the electronic components on the workpieces. In one particular embodiment, formation of the nitride-layer includes the formation of a silicon nitride spacer device. According to another embodiment, the silicon nitride layer can function as a hard mask.

Additionally, during the deposition process, other products between the reaction of the halogen-containing gas and the nitrogen-containing gas can occur, including the formation of particular byproducts. One such byproduct can include a hygroscopic compound. In particular, the hygroscopic compound can be can be formed on components of the processing chamber, including for example the wall, the manifold, the liner, the pedestal, as well as the workpieces contained within the processing chamber during the deposition process. According to one embodiment, the hygroscopic compound includes a nitrogen-containing compound. In another embodiment, the nitrogen-containing compound includes a halide. In one particular embodiment, the hygroscopic, nitrogen-containing compound includes ammonium chloride.

As illustrated, after completing the deposition process within region 205, the temperature within the processing chamber may be reduced to an idle temperature ($T_I$), which can be significantly less than the deposition temperature ($T_D$) within region 207. Also, after completing the deposition process, the processing chamber can be emptied of the gases and backfilled with an inert gas, such that the pressure within the processing chamber is increased.

While the idle temperature may be the same as the deposition temperature, more typically, the idle temperature is lower than the deposition temperature. In one embodiment, the idle temperature is less than the deposition temperature by at least approximately 10% of the deposition temperature. For example, in an embodiment using a deposition temperature of 600° C., the idle temperature may be approximately 10% less than the deposition temperature such that the idle temperature is 60° C. below the deposition temperature. In another embodiment, the idle temperature is lower than the deposition temperature by at least approximately 15% of the deposition temperature, such as at least approximately 20%, or even approximately 30% of the deposition temperature. Still, in one particular embodiment, the idle temperature is lower than the deposition temperature by not greater than approximately 50% of the deposition temperature.

In reference to certain values, in one embodiment, the idle temperature can be at least approximately 10° C. below the deposition temperature. In another embodiment, the idle temperature can be at least approximately 25° C. below the deposition temperature, or even at least approximately 100° C. below the deposition temperature. Generally, the idle temperature is not greater than approximately 300° C. below the deposition temperature. According to one particular embodiment, the idle temperature is within a range between approximately 200° C. and approximately 650° C.

Ramping down from the deposition temperature to the idle temperature at a controlled rate ensures that the workpieces properly cool and the layer deposited on the workpieces does not crack or undergo excessive stress and strain. As such, generally the temperature is decreased at a rate of not greater than approximately 15° C./minute. Other embodiments have a slower cooling rate, such as not greater than approximately 10° C./minute, or not greater than approximately 5° C./minute. Still, in other embodiments, the cooling rate is at least approximately 1° C./minute, such as approximately 3° C./minute. In one particular embodiment, the cooling rate from the deposition temperature to the idle temperature is within a range between approximately 3° C./minute approximately 5° C./minute.

Moreover, the idle temperature may be significantly different than the loading temperature. In one particular embodiment, the idle temperature is significantly less than the loading temperature ($T_L$). According to one embodiment, the idle temperature can be at least approximately 2% less than the loading temperature, such as at least approximately 5% less, or even approximately 10% less. In another embodiment, the idle temperature is not greater than approximately 20% less than the loading temperature.

In particular reference to some temperature values, the idle temperature can be approximately 10° C. below the loading temperature, such as at least approximately 25° C. below the loading temperature, or even at least approximately 50° C. below the loading temperature. Generally, the idle temperature is not greater than approximately 200° C. below the loading temperature ($T_L$).

After decreasing the temperature within the processing chamber to the idle temperature within region of 207, the temperature within the processing chamber may be stabilized at the idle temperature, and thus maintained for a time period within the processing chamber within region 209. Generally, the processing chamber can be held at the idle temperature for a time period of at least approximately 6 minutes. According to another embodiment, the time period at the idle temperature can be greater, such as at least approximately 10 minutes, such as at least approximately 15 minutes, or even at least approximately 90 minutes. According to one embodiment the processing chamber is held at the idle temperature for a time period within a range between approximately 15 minutes to approximately 60 minutes.

After stabilizing the temperature within the processing chamber at the idle temperature, the workpieces and the carrier holding the workpieces can be removed from the processing chamber within region 211. According to one embodiment, during the removal of the workpieces from the processing chamber the temperature within the processing chamber is decreased. In one embodiment, the temperature is decreased by lowering the set temperature on the controller by at least approximately 5° C. below the idle temperature. In another embodiment, the set temperature is lower, such as at least approximately 10° C. below the idle temperature, or at least approximately 15° C., or even approximately 25° C. below the idle temperature. In one particular embodiment, the temperature within the processing chamber can be decreased by turning off power to at least one of the heating elements surrounding the processing chamber. In a more particular embodiment, the temperature within region 211 can be reduced by turning off a heating element closest to the processing chamber door during the removal of the workpieces and carrier.

While removing the workpieces from the processing chamber within region 211 the temperature can be reduced such that upon complete removal of the workpieces, the processing chamber is decreased to a pull temperature ($T_P$). According to one embodiment, the pull temperature can be significantly less than the idle temperature. Generally, the pull temperature is less than the idle temperature by at least approximately 2% of the idle temperature. For example, if the idle temperature is 500° C., the pull temperature can be at least 10° C. below the idle temperature. In another embodiment, the pull temperature is less than idle temperature by at least approximately 5% of the idle temperature, such as at least approximately 8% of the idle temperature, or even at least approximately 10% of the idle temperature. According to one particular embodiment, the pull temperature is less than the idle temperature by not greater than approximately 30% of the idle temperature.

In reference to some particular temperature values, the pull temperature can be at least approximately 10° C. below the idle temperature. According to one embodiment, the pull temperature can be at least approximately 20° C. below the idle temperature, such as at least approximately 30° C. below the idle temperature, or even at least approximately 40° C. below the idle temperature. Still, the pull temperature is typically not greater than approximately 150° C. below the idle temperature.

The pull temperature can also be significantly below the deposition temperature. In one particular embodiment, the pull temperature is less than the deposition temperature by at least approximately 5% of the deposition temperature. In another embodiment, the pull temperature is less than the deposition temperature by at least approximately 10% of the deposition temperature, such as at least approximately 20% of the deposition temperature or even at least approximately 30% of the deposition temperature. In one particular embodiment, the pull temperature is less than the deposition temperature by not greater than approximately 60% of the deposition temperature.

In reference to some particular temperature values of various embodiments, the pull temperature can be at least approximately 50° C. below the deposition temperature. According to one embodiment, the pull temperature is at least approximately 100° C. below the deposition temperature, or at least approximately 125° C. below the deposition temperature, or even at least approximately 150° C. below the deposition temperature. According to one particular embodiment, the pull temperature can be generally within a range between approximately 100° C. and approximately 300° C. below the deposition temperature.

As illustrated in FIG. 2, the pull temperature within region 211 can be the lowest temperature reached within the processing chamber during continuous operation. Typically, the pull temperature is not greater than approximately 650° C. In other embodiments, the pull temperature can be less, such as not greater than approximately 625° C., or not greater than approximately 600° C. According to one particular embodiment, the pull temperature is within a range between approximately 400° C. and approximately 650° C.

As illustrated in FIG. 2, within region 211, the temperature within the processing chamber is being reduced for a period of time sufficient to completely remove the workpieces, and typically the carrier as well, from the processing chamber. In one embodiment, this time period can be at least approximately 11 minutes. According to another embodiment, the time period sufficient for complete removal of the workpieces can be at least approximately 21 minutes, such as at least approximately 25 minutes, or even at least approximately 31 minutes. Still, the time period sufficient for removing the workpieces from the processing chamber and the duration of cooling within the processing chamber within region 211 is generally not greater than approximately 120 minutes, and more typically within a range between approximately 11 minutes and approximately 61 minutes.

The average rate of cooling within the processing chamber during the removal of the workpieces within region 211 can be controlled while simultaneously the outgassing of particular hygroscopic compounds is suppressed. Accordingly, the average rate of cooling within the processing chamber is generally not greater than approximately 15° C./minute. According to another embodiment, the average cooling rate can be less, such as not greater than approximately 10° C./minute, such as not greater than approximately 8° C./minute, or even not greater than approximately 5° C./minute. According to one particular embodiment, the average cooling rate within the processing chamber during the removal of the workpieces can be within a range between approximately 3° C./minute and approximately 5° C./minute.

After the workpieces and the carrier are completely removed from the processing chamber at the end of the time period for region 211, a shutter, adjacent to and outside of the processing chamber, may be closed over the opening of the processing chamber. If a shutter is used, generally it is closed after the processed workpieces have been removed and before new workpieces are loaded onto a carrier and placed inside the processing chamber. According to one particular embodiment, the shutter substantially blocks the opening to the processing chamber. However, according to one particular embodiment, the shutter does not completely seal the processing chamber from the ambient environment. Closure of a shutter over the opening to the processing chamber is not required. In one particular embodiment, after the workpieces have been completely removed, an outgassing procedure, explained in following paragraphs, can be undertaken. In particular embodiments where a shutter is not used, the workpieces may be removed completely and moved a suitable distance from the opening of the processing chamber to avoid contamination during the outgassing procedure.

After completely removing the workpieces from the processing chamber, the temperature within the processing chamber can be increased, as illustrated within region 213, to an outgassing temperature ($T_O$). The temperature can be increased by elevating the set temperature on the controller by at least approximately 10° C. In another embodiment, the temperature is increased by elevating the set temperature by at least approximately 25° C., such as at least approximately 30° C., or even approximately 50° C. According to one particular embodiment, the temperature within the processing chamber can be increased by turning on all of the heating elements surrounding the processing chamber. As such, the heating rate within region 213 can be substantially high. In one embodiment, the heating rate within region 213 can be at least approximately 5° C./minute. According to another embodiment, the heating rate within the processing chamber after closing the shutter can be at least approximately 7° C./minute, such as at least approximately 10° C./minute. Generally, the heating rate does not exceed a rate of approximately 20° C./minute.

The time period for heating the processing chamber to the outgassing temperature within region 213 may depend upon the pull temperature, the desired outgassing temperature, and the heating rate. As such, the time period for heating the processing chamber to the outgassing temperature can be at least approximately 6 minutes. In one embodiment, the time period for heating the processing chamber the outgassing temperature can be at least approximately 10 minutes, such as at least approximately 15 minutes, or even at least approximately 30 minutes. Generally, the time period for reaching the outgassing temperature from the pull temperature is not greater than approximately 60 minutes.

After sufficient heating, the temperature within the processing chamber can be stabilized at the outgassing temperature. Notably, the outgassing temperature can be significantly greater than the pull temperature. In one embodiment, the outgassing temperature is greater than the pull temperature by at least approximately 5% of the pull temperature. In another embodiment, the outgassing temperature is greater than the pull temperature by at least approximately 8% of the pull temperature, such as at least approximately 10% of the pull temperature or at least approximately 15% of the pull temperature. In another particular embodiment, the outgassing temperature is greater than the pull temperature by not greater than approximately 45% of the pull temperature.

In reference to temperature values of some embodiments, according to one embodiment, the outgassing temperature can be at least approximately 10° C. greater than the pull temperature. In another embodiment, the outgassing temperature can be at least approximately 25° C. greater than the pull temperature, such as at least approximately 50° C. greater than the pull temperature. Generally, the outgassing temperature is not greater than approximately 200° C. above the pull temperature.

Moreover, the outgassing temperature may be the same temperature as the idle temperature, however, more typically, the outgassing temperature can be significantly greater than the idle temperature. In one embodiment, the outgassing temperature is greater than the idle temperature by not less than approximately 2% of the idle temperature. In another embodiment, the outgassing temperature is greater than the idle temperature by at least approximately 5% of the idle temperature, such as at least approximately 8% of the idle temperature, or even approximately 12% of the idle temperature. In one particular embodiment, the outgassing temperature is greater than the idle temperature by not greater than approximately 25% of the idle temperature.

In one embodiment, the outgassing temperature can be at least approximately 10° C. greater than the idle temperature. Other embodiments can use a greater difference such that the outgassing temperature can be at least approximately 20° C. greater, such as at least approximately 30° C. greater than the idle temperature. Generally, the outgassing temperature is not greater than approximately 150° C. greater than the idle temperature.

The outgassing temperature can be significantly less than the deposition temperature such that it is between the idle temperature and the deposition temperature. In one embodiment, the outgassing temperature is less than the deposition temperature by at least approximately 5% of the deposition temperature. In another embodiment, the outgassing temperature is less than the deposition temperature by at least approximately 8% of the deposition temperature, such as 10% of the deposition temperature, at least approximately 12% of the deposition temperature, or even at least approximately 15% of the deposition temperature. In one particular embodiment, the outgassing temperature is less than the deposition temperature within a range between approximately 8% and approximately 40% of the deposition temperature.

In reference to temperature values of some particular embodiments, according to one embodiment, the outgassing temperature can be at least approximately 25° C. less than the deposition temperature. In another embodiment, the outgassing temperature can be at least approximately 50° C. less than the deposition temperature, such as at least approximately 75° C. less than the deposition temperature. Generally, the outgassing temperature is not greater than approximately 300° C. less than the deposition temperature.

The outgassing temperature can be maintained for a time period sufficient to change the presence of certain hygroscopic byproducts within the atmosphere of the processing chamber, which may include lessening the amount of the hygroscopic byproducts, dehydrating the hygroscopic byproducts, or a combination of both. Particular hygroscopic byproducts includes halides, and more particularly, ammonium chloride. As such, the outgassing temperature can be held within the processing chamber for a time period of at least approximately 2 minutes. According to one embodiment, the outgassing temperature can be held within the processing chamber for a time period of at least approximately 11 minutes, such as at least approximately 15 minutes, or even at least approximately 61 minutes. In one particular embodiment, the outgassing temperature is maintained within the processing chamber for a time period between approximately 11 minutes and approximately 31 minutes.

After holding the outgassing temperature within the processing chamber for a suitable time period, the shutter, if one has been used, can be opened at the end of region 215. At this time, a new processing cycle can be initiated as indicated at the start of the time period 217 illustrated in FIG. 2. Initiation of a new processing cycle includes loading of different workpieces into the processing chamber, and preparing the processing chamber for another deposition process as described herein. As illustrated, the new processing procedure, including regions 217, 219, 221, 223, 225, 227, 229, 230, and 231, which is the same process described herein, including the integration of a cooling period during the removal of the processed workpieces, and raising of the temperature within the processing chamber for an outgassing process after removal of the processed workpieces.

Referring now to the processing chamber and its components, FIGS. 3 and 4 include cross-sectional illustrations of the processing chamber and certain components. FIG. 3 includes a cross-sectional illustration of a processing chamber 301 with workpieces 333 and a carrier 331 included therein in accordance with one embodiment. The processing chamber 301 can include conventional or proprietary materials and a conventional or proprietary design suitable for processing workpieces therein.

The processing chamber 301 has an opening 305 including a valve, and a vacuum pump 309 connected to the opening 305 suitable for reducing the pressure within the processing chamber 301. The processing chamber 301 further includes tanks 341 and 343 coupled to the processing chamber 301 near a door 313. Such tanks 341 and 343 can include gaseous compounds, such as the nitrogen-containing gas and halogen-containing gas that facilitate the deposition process. The processing chamber 301 can include additional valves, filters, flow controllers, and tanks, which are not illustrated but which can have various configurations and are suitable for controlling gas flow and the environment within the processing chamber 301.

FIG. 3 further includes heating elements 321, 322, 323, 324, and 325 (321-325) wrapping around the periphery of the processing chamber 301. A first heating element 321 is closest to the door 313 of the processing chamber 301. Such heating elements 321-325 are suitable for controlling the temperature within the processing chamber. As illustrated, each of the heating elements 321-325 can be individually controlled through the use of a controller 329, which can include hardware, software, firmware, or any combination thereof suitable for controlling the heating elements 321-325 and thus the temperature within the processing chamber 301 during the processing cycle. Each of the heating elements 321-325 can include conventional or proprietary materials suitable for forming heating elements.

The door 313 is located at one end of the processing chamber 301 and is suitable for sealing the processing chamber 301 from the ambient environment and facilitates maintaining a reduced pressure atmosphere within the processing chamber used during the deposition process. The door 313 can be connected to a motor 317, which in turn can be connected to the controller 329, which can facilitate automatic opening and closing of the door 313. The door 313 can include features suitable for sealing a door from the ambient environment, such as an o-ring. The door 313 can include conventional materials suitable for use in the processing chamber 301.

As illustrated, during the deposition process the processing chamber 301 is sealed by the door 313 and the workpieces 333 are contained within the processing chamber 301 on the carrier 331. As described herein, during deposition, gases can be flowed into the processing chamber 301 and reacted to form a chemical product which forms a layer of material on the workpieces 333. In addition, chemical byproducts can be formed within the processing chamber 301 during the deposition process. Such byproducts can be deposited on available surfaces including notably the workpieces if they are present. The chemical byproduct can also be formed on components of the processing chamber 301, including for example the walls, manifold, liner, pumps, and pedestal.

FIG. 4 includes a cross-sectional illustration of a processing chamber 301 and its components without the workpieces and the carrier contained therein in accordance with one embodiment. As illustrated, during the outgassing process, the door 313 is open, the workpieces 333 and the carrier 331 have been removed, and the interior of the processing chamber 301 is empty. Notably, a shutter 401 is covering the opening 405 of the processing chamber 301. The shutter can include an organic or inorganic material or any combination thereof. According to one particular embodiment, the shutter can include a metal or ceramic material.

As illustrated, the shutter 401 is adjacent to and covering the opening 401 of the processing chamber 301, however, the shutter 401 does not necessarily seal the interior of the processing chamber 301 from the ambient environment. Accordingly, moisture from the ambient atmosphere is accessible within the interior of the processing chamber 301 and as such, particular hygroscopic species can be reduced during the outgassing process.

The shutter 401 can be connected to a motor 403 that can be connected to the control 329, which may include hardware, software, or firmware for automatic control of opening and closing of the shutter 401. Alternatively, the shutter 401 can be manually controlled.

The processing procedures and components described herein facilitate reduction of byproducts, particularly hygroscopic compounds, formed within the processing chamber during a deposition process that can damage processing chamber components and cause defects in the workpieces. In particular, the combination of the shutter, post-deposition cooling cycle during the removal of the workpieces, and the outgassing procedure facilitates the removal, or substantial lessening of harmful compounds within the processing chamber. The combination of said features facilitates extended lifetime of components within the processing chamber as well as improved product quality.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a method of processing an electronic device can include operating a processing chamber at a first temperature while a workpiece is being processed. The process can also include removing the workpiece and a carrier holding the workpiece from the processing chamber while decreasing the temperature within the processing chamber to a second temperature significantly lower than the first temperature. The process can further include increasing the temperature within the processing chamber to a third temperature significantly greater than the second temperature and significantly less than the first temperature while the processing chamber has no workpiece or carrier within.

In one embodiment of the first aspect, the first temperature is at least approximately 350° C. In another embodiment, the method further includes closing a shutter adjacent to and outside of the processing chamber after the workpiece and the carrier are removed, wherein closing the shutter is performed after removing the workpiece and before increasing the temperature.

In another embodiment of the first aspect, the method of operating the processing chamber further includes flowing a nitrogen-containing gas into the processing chamber, flowing a halogen-containing gas into the processing chamber, and forming a hygroscopic compound along a wall of the processing chamber. In a particular embodiment the nitrogen-containing gas comprises $N_2$, $NH_3$, $N_2H_4$, or any combination thereof. In another particular embodiment, the halogen-containing gas includes an element including, silicon, cobalt, molybdenum, titanium, tungsten, tantalum, or any combination thereof. In one embodiment, the hygroscopic compound includes a nitrogen-containing halide. In a particular embodiment, the hygroscopic compound includes ammonium chloride. In another particular embodiment, the layer of material includes silicon nitride.

In another embodiment of the first aspect, decreasing the temperature to a second temperature is carried out for a time period sufficient to completely remove the workpiece and the carrier from the processing chamber. In a particular embodiment, the time period is at least approximately 11 minutes.

In one embodiment of the first aspect, the method further includes decreasing the temperature within the processing chamber to a fourth temperature significantly less than the first temperature before removing the workpiece and the carrier. In another embodiment, the method also includes holding the temperature within the processing chamber at a fourth temperature for a time period of at least approximately 5 minutes. In another particular embodiment, the second temperature is significantly less than the fourth temperature. In another embodiment, the third temperature is significantly greater than the fourth temperature. Still, in one particular embodiment, the third temperature is between the first temperature and the fourth temperature.

In another embodiment of the first aspect, the method includes holding the temperature within the processing chamber at the third temperature for a time period, and opening a shutter adjacent to and outside of the processing chamber after the time period. In another embodiment, the method also includes loading a different workpiece into the processing chamber after opening the shutter, and increasing the temperature within the processing chamber after loading the different workpiece.

In a second aspect, a method of processing electronic devices includes depositing a layer of material on a portion of a workpiece within a processing chamber at a deposition temperature, and decreasing the temperature within the processing chamber to an idle temperature significantly lower than the deposition temperature. The method also includes removing the workpiece and a carrier holding the workpiece from the process chamber while decreasing the temperature within the processing chamber to a pull temperature significantly lower than the deposition temperature and the idle temperature. The method further includes closing a shutter adjacent to and outside of the processing chamber after removing the workpiece and the carrier from the processing chamber, and increasing the temperature within the processing chamber to an outgassing temperature after closing the shutter and holding the temperature within the processing chamber at the outgassing temperature for a time period. According to one embodiment of the second aspect, the processing chamber includes a first heating element and a second heating element closer to a door of the processing chamber, and decreasing the temperature to a pull temperature includes turning off power to the second heating element closer to the door.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of processing an electronic device comprising:
    loading a workpiece into a processing chamber, the processing chamber at a loading temperature;
    operating the processing chamber at a first temperature while the workpiece is being processed;
    decreasing the temperature within the processing chamber from a first temperature to a second temperature less than the first temperature and less than the loading temperature;
    removing the workpiece and a carrier holding the workpiece from the processing chamber while decreasing the temperature within the processing chamber, by turning off power to all heating elements used to control the temperature within the processing chamber, from the second temperature to a third temperature lower than the first temperature and the second temperature;
    increasing the temperature within the processing chamber to a fourth temperature greater than the second temperature and less than the first temperature while the processing chamber has no workpiece or carrier within; and
    maintaining the temperature within the processing chamber at the fourth temperature for a time period to perform an outgassing operation closing a shutter adjacent to and outside of the processing chamber after the workpiece and the carrier are removed, wherein closing the shutter is performed after removing the workpiece and before increasing the temperature, the shutter not sealing the processing chamber from the ambient environment.

2. The method of claim 1, wherein the operating the processing chamber at a first temperature further comprises:
    flowing a nitrogen-containing gas into the processing chamber;
    flowing a halogen-containing gas into the processing chamber; and
    forming a hygroscopic compound along a wall of the processing chamber.

3. The method of claim 2, wherein the nitrogen-containing gas comprises $N_2$, $NH_3$, $N_2H_4$, or any combination thereof.

4. The method of claim 2, wherein the halogen-containing gas comprises an element including, silicon, cobalt, molybdenum, titanium, tungsten, tantalum, or any combination thereof.

5. The method of claim 2, wherein the hygroscopic compound includes a nitrogen-containing halide.

6. The method of claim 5, wherein the hygroscopic compound includes ammonium chloride.

7. The method of claim 2, wherein the operating the processing chamber at a first temperature includes depositing a layer of material comprising silicon nitride.

8. The method of claim 1, wherein the decreasing the temperature to the third temperature is carried out for a second time period sufficient to completely remove the workpiece and the carrier from the processing chamber.

9. The method of claim 8, wherein the time period is at least approximately 11 minutes.

10. The method of claim 1, wherein the first temperature is at least approximately 350° C.

11. The method of claim 1, further comprising maintaining the temperature within the processing chamber at the second temperature for a time period of at least approximately 5 minutes.

12. The method of claim 1, further comprising:
    maintaining the temperature within the processing chamber at the third temperature for a third time period; and
    opening a shutter adjacent to and outside of the processing chamber after the third time period.

13. The method of claim 12, further comprising:
    loading a different workpiece into the processing chamber after opening the shutter; and
    increasing the temperature within the processing chamber after loading the different workpiece.

14. The method of claim 1, wherein the operating the processing chamber at a second temperature is performed for a period of at least 6 minutes.

15. A method of processing electronic devices comprising:
    loading a workpiece into a processing chamber, the processing chamber at a loading temperature;
    depositing a layer of material on a portion of the workpiece within the processing chamber at a deposition temperature;
    decreasing the temperature within the processing chamber from the deposition temperature to an idle temperature lower than the deposition temperature;
    removing the workpiece and a carrier holding the workpiece from the processing chamber while decreasing the temperature within the processing chamber, by turning off power to all heating elements used to control the temperature within the processing chamber, from the idle temperature to a pull temperature to a pull temperature lower than the deposition temperature and the idle temperature;
    closing a shutter adjacent to and outside of the processing chamber after removing the workpiece and the carrier from the processing chamber; and increasing the temperature within the processing chamber to an outgassing temperature after closing the shutter and maintaining the temperature within the processing chamber at the outgassing temperature for a time period of at least 6 minutes to perform an outgassing operation.

16. The method of claim 15, wherein the processing chamber includes a first heating element and a second heating element closer to a door of the processing chamber, and the decreasing the temperature to a pull temperature includes turning off power to the second heating element closer to the door.

17. The method of claim 15, further comprising maintaining the processing chamber at the idle temperature for a period of at least 6 minutes.

18. A method of processing electronic devices comprising:

loading a workpiece into a processing chamber, the processing chamber at a loading temperature;

depositing a layer of material on a portion of the workpiece within the processing chamber at a deposition temperature, the deposition temperature being greater than the loading temperature;

decreasing the temperature within the processing chamber from the deposition temperature to an idle temperature lower than the deposition temperature and lower than the loading temperature;

removing the workpiece and a carrier holding the workpiece from the process chamber while decreasing the temperature within the processing chamber, by turning off power to all heating elements used to control the temperature within the processing chamber, from the idle temperature to a pull temperature to a pull temperature lower than the idle temperature, the rate of cooling within the process chamber to suppress outgassing;

closing a shutter adjacent to and outside of the processing chamber after removing the workpiece and the carrier from the processing chamber; and increasing the temperature within the processing chamber to an outgassing temperature after closing the shutter and maintaining the temperature within the processing chamber at the outgassing temperature for a time period of at least 6 minutes to perform an outgassing operation, the outgassing temperature being greater than the idle temperature.

19. The method of claim 18, further comprising maintaining the processing chamber at the idle temperature for a period of at least 6 minutes.

* * * * *